Oct. 17, 1967 F. WIEMAN 3,348,125

HIGH POWER FREQUENCY MULTIPLIER

Filed Jan. 8, 1965

INVENTOR.
FRANCIS WIEMAN
BY Orland M. Christensen
ATTORNEY

United States Patent Office 3,348,125
Patented Oct. 17, 1967

3,348,125

HIGH POWER FREQUENCY MULTIPLIER

Francis Wieman, Seattle, Wash., assignor to The Boeing Company, Seattle, Wash., a corporation of Delaware Filed Jan. 8, 1965, Ser. No. 424,270
8 Claims. (Cl. 321—69)

ABSTRACT OF THE DISCLOSURE

A frequency multiplier is disclosed which makes use of a plurality of push-pull frequency multiplication circuits operated in phase and in parallel in a manner such that the applied signal is essentially operated on simultaneously by the individual frequency multipliers with the multiplied output signals being summed in a power adder to thereby provide a high power signal having a frequency which is a multiple of the input signal. Low power varactors are used in the individual sections and yet by using a plurality of the same in an arrangement such as described the overall system can be used to handle substantial power. A detailed schematic circuit diagram is disclosed for tripling the frequency of an applied input signal.

Figure 1:
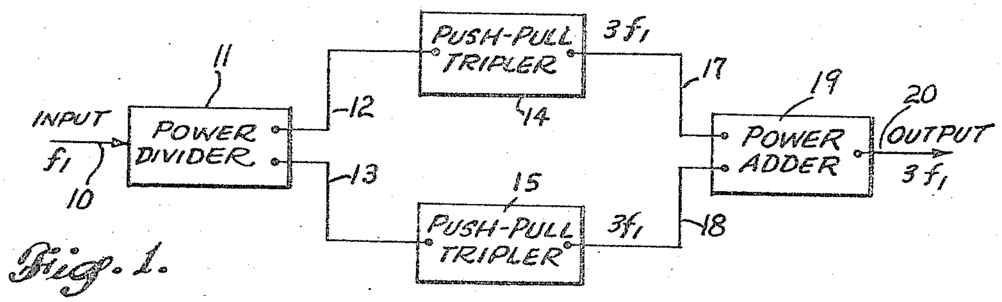

In the operation of various types of electronic equipment, such as for example radar systems, it is advantageous to be able to multiply or increase the frequency of a given signal. For example, it is advantageous to be able to use relatively low frequency signal generating equipment in the initial stages of a system and then near the output of the system to utilize a frequency multiplier to obtain the desired very high frequency output signals. It is desirable to provide the frequency multiplication in an efficient manner and thus have substantial power available at the output, and yet avoid the generation of extraneous noise signals by the multiplier circuitry. It is therefore an object of the present invention to provide an improved frequency multiplier.

It is another object of the present invention to provide an improved efficient frequency multiplier operable at very high frequencies.

A further object of the present invention is to provide a solid-state frequency multiplier which operates in an efficient manner to provide very high frequency output signals at substantial power in response to an applied signal.

Another object of the present invention is to provide a solid-state frequency multiplier making use of a plurality of variable reactance devices such as varactors without the usual problems of component mismatch.

Another object of the present invention is to provide a frequency tripler operable at very high frequencies and making use of a plurality of varactors.

Parametric frequency multipliers and frequency multipliers making use of variable reactance devices such as variable capacitance diodes, commonly referred to in the art as varactors, have been known and used for some time. Prior attempts at providing frequency multipliers capable of handling increased power have been limited by the power handling capability of a single variable reactor such as a varactor, and the difficulty of matching several varactors for multiple use. These problems as well as others are overcome in accordance with the teachings of the present invention through the use of a plurality of individual push-pull frequency multipliers in combination with power division and power adding circuits respectively connected to the input and output circuits of the individual push-pull frequency multipliers. By splitting the power in an applied signal and using individual push-pull frequency multiplier sections for providing frequency multiplication of the divided portions of the applied signal, it is found that a plurality of relatively low power varactors can be used to handle substantial power. Thus the power handling capability of the system is greater than would be the case if a single one of the varactors was used, and yet the problems heretofore encountered in attempts to use a large number of varactors are avoided.

In one specific system disclosed in greater detail hereinafter two individual push-pull frequency triplers have their input circuits connected to a power divider and their output circuits connected to a power adder so that the signal frequency to be multiplied is divided and applied simultaneously to the individual triplers. Each of the two individual push-pull triplers makes use of a pair of varactors but due to the circuit arrangement the varactors are merely approximately matched in pairs rather than all four being closely matched. It is found in practice that while it is extremely difficult to closely match four varactors, the matching of two varactors is a relatively simple matter and therefore efficient tripling of frequency is achieved with a plurality of varactors without varactor matching problems being encountered.

Figure 2:
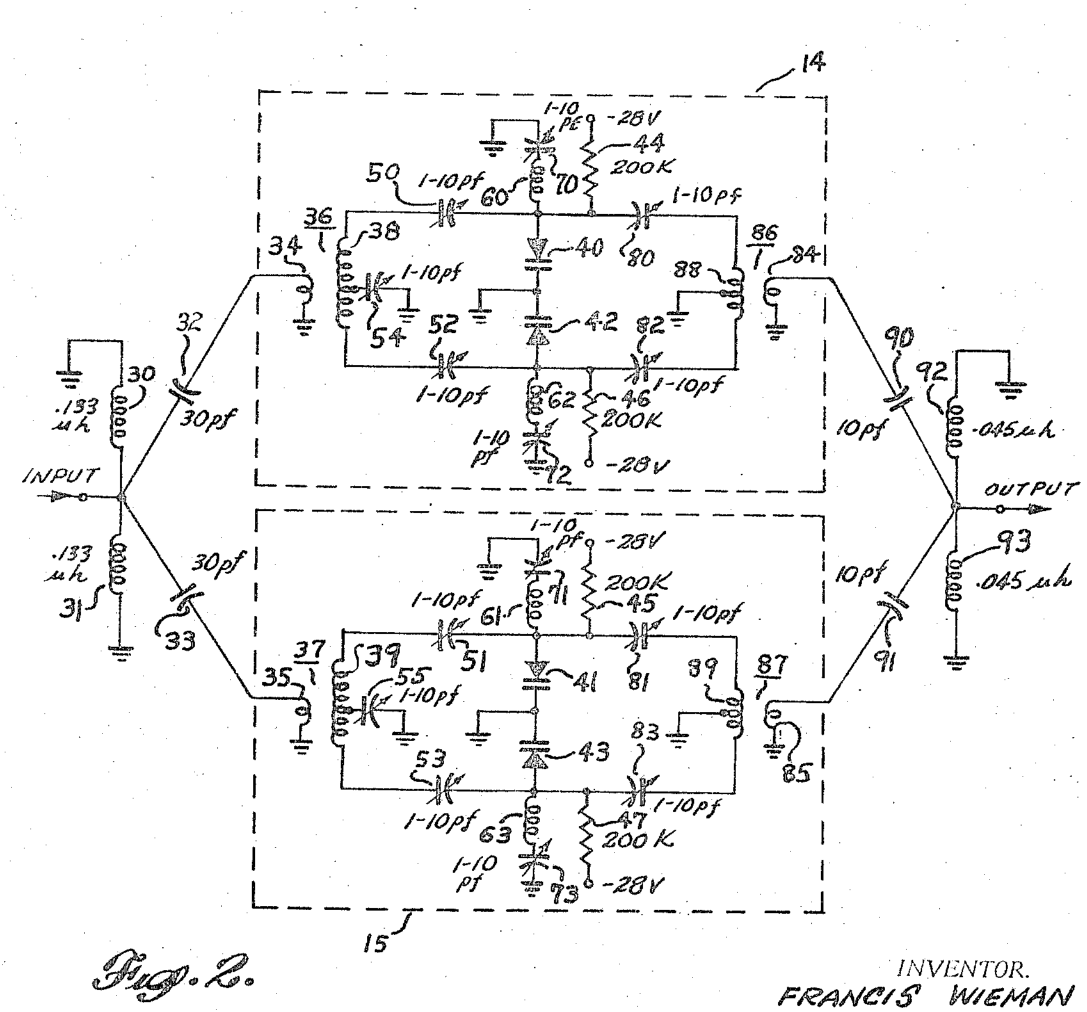

The above as well as additional advantages and objects of the present invention will be more clearly understood from the following description when read with reference to the accompanying drawing wherein, FIGURE 1 is a block diagram of a preferred embodiment of the present invention, and FIGURE 2 is a schematic circuit diagram of one specific embodiment of the invention for tripling the frequency of an applied input signal with the component values being included on FIGURE 2 for illustrating one system wherein an applied 108 megacycle signal is multiplied to provide output signals at 324 megacycles.

Referring now to the drawing and in particular to FIGURE 1 a system for multiplying the frequency of an applied signal is shown in generalized form. For purpose of illustration only, the system in FIGURE 1 will be explained for the condition of tripling the frequency of an applied signal. An input signal at frequency $f_1$ is applied over the input circuit 10 to a power dividing network 11 which serves to split the power in the applied signal and provide substantially one half of the applied power to each of its two signal output circuits 12 and 13. First and second push-pull frequency triplers 14 and 15 are respectively connected to the leads 12 and 13 and are adapted to receive the in phase signals provided by the power divider 11. As described in greater detail hereinafter, each of the tripler networks 14 and 15 makes use of a pair of varactors connected in push-pull circuit arrangement for multiplying the frequency of the applied signals so that each of the respective push-pull output circuits 17 and 18 will provide signals at a frequency of $3f_1$ to a power adding network 19. The signals on the leads 17 and 18 applied to the power adder 19 are in phase. A signal output circuit 20 is connected to the power adder 19 for providing signals at a frequency of $3f_1$.

It is found in practice that by using push-pull frequency multiplier circuits in a circuit arrangement with the input signals thereto being provided by a power dividing network, the problems previously associated with matching varactors are effectively eliminated. Idler circuits in each of the push-pull circuits aid in generating and sustaining desired harmonics of the input signal which harmonics are added to the input frequency by the variable capacitance varactors to povide a multiple of the signal frequency applied to the power dividing network 11.

Referring now to FIGURE 2 there is shown for purpose of illustration a schematic circuit diagram of a frequency multiplying system adapted to receive input signals at one frequency and provide output signals at a frequency of three times the input signal frequency. The tripler circuit of FIGURE 2 includes a power dividing circuit comprised of first and second inductors 30 and 31 connected in parallel between the input circuit 10 and a point of reference potential referred to herein as signal ground, together with a first capacitor 32 and transformer primary winding 34 connected in series circuit between the input circuit 10 and ground and a second capacitor 33 and second transformer primary winding 35 connected in series circuit from the input circuit 10 to signal ground. The input transformers 36 and 37 having the primary windings 34 and 35 and center tapped secondary windings 38 and 39 serve to match the frequency multiplying circuit impedance to the impedance of the signal source providing the input signal. The transformers 36 and 37 are step-up transformers for increasing the voltage to be applied to the varactors described hereinafter.

The two push-pull frequency multipliers 14 and 15 of FIGURE 1 are substantially identical as shown in FIGURE 2 and operate in the same manner. Thus the first push-pull multiplier circuit 14 includes first and second variable reactance devices shown as varactors 40 and 42 while the second push-pull multiplier includes third and fourth varactors 41 and 43. As is well nown in the art, the varactors 40–43 are semiconductor diodes whose capacitance varies in response to a variation in the voltage across the diodes. Thus they are in effect non-linear capacitors which when connected in an appropriate circuit will produce harmonics of an applied signal. To maintain each of the varactors reversely biased for proper operation each has its anode connected to a negative voltage through the respective impedance elements shown as the resistors 44, 45, 46 and 47. The cathodes of the various varactors will be seen to be directly connected to signal ground. Each varactor anode is connected to a secondary winding of the input transformers 36 and 37 through the respective variable capacitors 50, 51, 52 and 53. The center of each transformer secondary winding 38 and 39 is connected to signal ground through an adjustable capacitor 54 and 55, respectively, to permit adjustment and compensation for any unbalance which might exist in the two halves of the transformer secondaries. The values of the various components are so selected that the varactor 40, capacitor 50, and one half of the transformer secondary winding 38 provide a circuit resonant at the frequency of the signal applied to the input circuit 10. In a similar manner the varactor 42, capacitor 52 and other half of the secondary winding 38 form a circuit resonant at the frequency of the applied input signal. Varactor 41, capacitor 51 and one half of the transformer secondary 39 as well as the varactor 43, capacitor 53 and other half of the transformer secondary 39 provide two additional circuits each resonant at the frequency of the applied signal.

Idler circuits are included in the push-pull multipliers to make certain that selected harmonic currents have an unimpeded path through the varactors. The idler circuits provide series resonant circuit paths which are resonant at twice the frequency of the input signal when the system is used for tripling the frequency of an applied signal. Thus it will be seen that the varactor 40 has its anode connected through the inductor 60 and variable capacitor 70 to signal ground; the varactor 42 has its anode connected through the inductor 62 and variable capacitor 72 to signal ground; the varactor 41 has its anode connected through the inductor 61 and variable capacitor 71 to signal ground; and the varactor 43 has its anode connected through the inductor 63 and variable capacitor 73 to signal ground. Four resonant idler circuits are thus provided, each of which includes one of the varactors, one of the inductors 60–63, and one of the variable capacitors 70–73. When the circuit is used for tripling the frequency of an applied signal the values of the components in these four circuits are adjusted so that each is resonant at a frequency which is twice the frequency of the applied input signals.

Each varactor is further included in one of four additional resonant circuits which are each resonant at the desired multiple of the frequency of the applied input signals. In the example shown in FIGURE 2 these additional resonant circuits are each resonant at three times the frequency of the applied input signal. Thus it will be seen that the varactor 40 has its anode connected through a variable capacitor 80 and one half of the secondary winding 88 of an output transformer 86 to signal ground; the varactor 42 has its anode connected through a variable capacitor 82 and the other half of the secondary winding 88 to signal ground; the varactor 41 has its anode connected through a variable capacitor 81 and half of the primary winding 89 of an output transformer 87 to signal ground; and the fourth varactor 43 has its anode connected through a variable capacitor 83 and the other half of the transformer primary winding 89 to signal ground. The various components are so adjusted that each varactor in combination with the associated one of the capacitors 80–83 and section of the primary windings 88 and 89 provides a circuit resonant at a frequency of three times the frequency of the input signal to the system.

The circuit arrangement is such that the secondary windings 84 and 85 of the transformers 86 and 87 are provided with in phase signals at three times the frequency of the signals applied to the primary windings 34 and 35 of transformers 36 and 37. The power in the output signals from the frequency tripling push-pull circuits is combined in the power adding network 19. In the example of the invention shown in FIGURE 2 the power adding network 19 includes the capacitor 90 and inductor 92 connected in series circuit with the transformer secondary winding 84, and the capacitor 91 and inductor 93 connected in series circuit with the secondary winding 85. The common junction of the capacitors 90 and 91 and inductors 92 and 93 is the non-grounded signal output circuit for the frequency multiplier system.

The operation of the circuit shown in FIGURE 2 is as follows. The power in an applied input signal at frequency $f_1$ is divided and applied in phase to the transformer primary windings 34 and 35 so that the varactors 40–43 will be provided with input signals at the frequency of the input. The circuit arrangement is such that the varactors 40 and 42 will operate in push-pull fashion with each varactor being included in three series resonant circuits as described above. That is, the varactor 40 will be included in a circuit which is resonant at the frequency of the applied signal with said resonant circuit including the transformer secondary winding 38; a circuit resonant at the second harmonic of the applied signal and including the inductor 60 and capacitor 70; and in a circuit resonant at three times the frequency of the applied signal and including the transformer primary winding 88. Each of the other varactors 40–43 is similarly included in three separate series resonant circuits so that the output transformers 86 and 87 will be simultaneously energized with in phase signals at a frequency which is three times the frequency of the applied input signal. These in phase signals are combined in the power adding network 19 to provide a single output signal at three times the frequency of the applied input signal. Since each varactor has only a fraction of the total input power applied thereto, the system can make use of relatively low power capability varactors and yet handle input signals of relatively high power. In one system constructed in accordance with the teachings of FIGURE 2 and using the component values shown in FIGURE 2 for multiplying the frequency of an applied input signal of 108 megacycles by a factor of 3 it was found that a 42 watt output signal at 324 megacycles could be obtained from a 64 watt input signal of 108 megacycles. The capacitances are in picofarads and the inductances in microhenries. While various types of varactors can be used, in one specific arrangement those manufactured by Microwave Associates and identified as their part number MA4061A were found to work well.

While the invention has been disclosed by reference to a preferred specific embodiment, various modifications and changes will be obvious to those skilled in the art from the teachings hereof. Thus it is intended that such modifications and changes be encompassed by the following claims.

What is claimed is:

1. A high frequency signal multiplier comprising in combination: a power dividing circuit for receiving applied signals at a first frequency and dividing the power of said applied signals into a plurality of in phase signals at said first frequency; a plurality of individual push-pull signal frequency multiplier circuits coupled with said divider circuit and each adapted to receive said in phase signals at said first frequency and to provide signals in phase and at a second frequency which is a multiple of said first frequency; a power adding circuit coupled with each of said push-pull signal multiplier circuits for adding the power in the in phase output signals therefrom; and signal output circuit means coupled with said power adding circuit.

2. A frequency multiplying system comprising in combination: power dividing circuit means for receiving applied signals at a first frequency and for dividing the power of said applied signals into first and second signals at said first frequency; first push-pull frequency multiplying circuit means including first and second variable reactance devices coupled with said power dividing circuit means adapted to receive said first signals and in response thereto to provide third signals at a frequency which is three times that of said first frequency; second push-pull frequency multiplying circuit means including third and fourth variable reactance devices coupled with said power dividing circuit means adapted to receive said second signals and in response thereto to provide fourth signals at three times said first frequency; and power adding circuit means coupled with said first and second push-pull frequency multiplying circuit means adapted to add the power of said third and fourth signals to thereby provide output signals at three times said first frequency.

3. A frequency multiplying system as defined in claim 2 wherein each of said variable reactance devices is a varactor.

4. A frequency tripling circuit comprising in combination: signal input circuit means; first and second transformers each having a primary winding coupled with said input circuit means for receiving input signals of a first frequency; a first variable reactance harmonic generating device; means including said first device and a first part of the secondary winding of said first transformer defining a first resonant circuit resonant at said first frequency; a second variable reactance harmonic generating device; means including said second device and a second portion of the secondary winding of said first transformer defining a second resonant circuit resonant at said first frequency; first and second idler circuit means respectively including said first and second devices and each resonant at a second frequency which is twice said first frequency; third and fourth resonant circuit means respectively including said first and second devices and each resonant at a third frequency equal to the sum of said first and second frequencies; third and fourth variable reactance harmonic generating devices; means including said third device and a first portion of the secondary winding of said second transformer defining a fifth resonant circuit resonant at said first frequency; means including said fourth device and a second portion of the secondary winding of said second transformer defining a sixth resonant circuit resonant at said first frequency; third and fourth idler circuit means respectively including said third and fourth devices and each resonant at said second frequency; seventh and eighth resonant circuit means respectively including said third and fourth devices and each resonant at said third frequency; and power adding signal output circuit means coupled with said third, fourth, seventh and eighth resonant circuit means adapted to add the power therein at said third frequency.

5. A frequency multiplying circuit as defined in claim 4 wherein each of said devices is a varactor.

6. A frequency multiplying circuit as defined in claim 4 wherein said third and fourth resonant circuit means each includes a separate portion of the primary winding of a third transformer, said seventh and eighth resonant circuit means each includes a separate portion of the primary winding of a fourth transformer, and said power adding signal output circuit means includes the secondary windings of said third and fourth transformers.

7. A frequency multiplying system comprising in combination: first and second variable capacitance diodes; first and second transformers; circuit means connecting said first diode in series circuit with one half of the secondary winding of said first transformer and in series circuit with one half of the primary winding of said second transformer to define first and second resonant circuits respectively resonant at first and second frequencies; circuit means connecting said second diode in series circuit with the other half of the secondary winding of said first transformer and in series circuit with the other half of the primary winding of said second transformer to define third and fourth resonant circuits respectively resonant at said first and second frequencies; third and fourth variable capacitance diodes; third and fourth transformers; circuit means connecting said third diode in series circuit with one half of the secondary winding of said third transformer and in series circuit with one half of the primary winding of said fourth transformer to define fifth and sixth resonant circuits respectively resonant at said first and second frequencies; circuit means connecting said fourth diode in series circuit with the other half of the secondary winding of said third transformer and in series circuit with the other half of the primary winding of said fourth transformer to define seventh and eighth resonant circuits respectively resonant at said first and second frequencies; signal input circuit means coupled with the primary windings of said first and third transformers for applying input signals at said first frequency thereto; and signal output circuit means coupled with the secondary windings of said second and fourth transformers.

8. A frequency multiplying system as defined in claim 7 and further including first, second, third, and fourth signal idler circuits each respectively coupled with one of said diodes and each resonant at a third frequency which is a harmonic of said first frequency and which is equal to the difference between said second frequency and said first frequency.

References Cited

UNITED STATES PATENTS

| | | | |
|---|---|---|---|
| 2,440,465 | 4/1948 | Ferguson | 321—65 X |
| 3,185,914 | 5/1965 | Gunn | 321—69 |
| 3,255,400 | 6/1966 | Morgan | 321—69 |
| 3,271,656 | 9/1966 | Hines et al. | 321—69 |

OTHER REFERENCES

"Charge Storage Varactors Boost Harmonic Power," by G. Schaffner, Electronics, July 13, 1964, pp. 42–47.

JOHN F. COUCH, *Primary Examiner.*

G. GOLDBERG, *Examiner.*